(12) United States Patent
Draad et al.

(10) Patent No.: US 6,580,612 B2
(45) Date of Patent: Jun. 17, 2003

(54) ELECTRIC CIRCUIT

(75) Inventors: Gerrit A. Draad, Oss (NL); Petrus Hubertus Maria Van Der Wielen, Oss (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/781,484

(22) Filed: Feb. 12, 2001

(65) Prior Publication Data

US 2001/0019474 A1 Sep. 6, 2001

(30) Foreign Application Priority Data

Feb. 17, 2000 (EP) .............................. 00200529

(51) Int. Cl.[7] .................................. H05K 7/20
(52) U.S. Cl. ..................... 361/719; 165/80.3; 257/719
(58) Field of Search .............. 165/80.2, 80.3, 165/185; 361/704, 705, 707, 709–712, 717–719; 257/718, 719, 726, 727; 174/16.3

(56) References Cited

U.S. PATENT DOCUMENTS

| 3,548,927 A | * 12/1970 | Spurling |
| 4,054,901 A | 10/1977 | Edwards et al. ............... 357/81 |
| 4,544,942 A | * 10/1985 | McCarthy .................... 257/721 |
| 4,609,040 A | * 9/1986 | Moore ........................ 165/80.3 |
| 5,274,193 A | * 12/1993 | Bailey et al. ............... 174/16.3 |
| 5,309,979 A | 5/1994 | Brauer ........................ 165/80.2 |
| 5,450,284 A | * 9/1995 | Wekell ........................ 361/710 |
| 5,991,154 A | * 11/1999 | Clemens et al. ............. 361/704 |

FOREIGN PATENT DOCUMENTS

GB 2237682 A 5/1991 ........... H01L/23/34

* cited by examiner

Primary Examiner—Gerald Tolin

(57) ABSTRACT

An electronic circuit is equipped with a lid-shaped heat sink made from aluminum sheet. Components are held in contact with the wall of the heat sink by means of lugs connected to the heat sink. The lugs are formed by bending U-shaped parts of the aluminum sheet out of the plane of the aluminum sheet.

12 Claims, 2 Drawing Sheets

ELECTRIC CIRCUIT

BACKGROUND OF THE INVENTION

The invention relates to an electric circuit comprising
a printed circuit board,
a component provided on the printed circuit board,
a heat sink secured to the printed circuit board and provided with a wall, which is in thermal contact with the component, and with a lug for pressing the component against the wall of the heat sink.

Such an electric circuit is disclosed in U.S. Pat. No. 5,309,979. In the known electric circuit, the cooling plate extends in a direction parallel to the printed circuit board, while the wall is at right angles to the cooling plate and hence also at right angles to the printed circuit board. The lug is provided at right angles to the cooling plate by means of a screw and is also in direct contact with the component. A satisfactory thermal contact between the component and the wall of the heat sink is ensured by means of the lug. As a result of this satisfactory thermal contact, the heat generated by the component during operation of the electric circuit is effectively dissipated. A drawback of the known electric circuit is, however, that the provision of the lug on the heat sink is comparatively complicated and hence expensive.

BRIEF SUMMARY OF THE INVENTION

Therefore, it is an object of the invention to provide an electric circuit wherein components forming part of the circuit are effectively cooled, while also the heat sink can be manufactured in a comparatively simple manner.

To achieve this, an electric circuit as mentioned in the opening paragraph is characterized in accordance with the invention in that the lug is formed by moving a part of the heat sink with respect to the remaining part of the heat sink in such a manner that an opening adjoining the lug is formed in the heat sink.

In an electric circuit in accordance with the invention, the lug is formed from the material used for the cooling plate, so that said lug does not have to be manufactured separately. In addition, means for securing the lug to the cooling plate are not necessary. The cooling plate and hence also the electric circuit can thus be manufactured in a simple and inexpensive manner. It has been found that, in an electric circuit in accordance with the invention, the heat generated by the component can be effectively dissipated. It has also been found that the construction of an electric circuit in accordance with the invention is barely sensitive to tolerances.

It proved comparatively simple to bring about good thermal contact between the wall and the component if said wall extends at right angles to the printed circuit board.

Good results have also been achieved using embodiments of an electric circuit in accordance with the invention, wherein the heat sink also comprises a flat cooling plate, which extends parallel to the printed circuit board. In these embodiments, the lug can be satisfactorily positioned with respect to the component in a comparatively simple manner if the opening adjoining the lug is at least partly situated in the flat cooling plate.

The lug in an electric circuit in accordance with the invention preferably extends from an edge of an opening formed in the heat sink, and presses the component against a wall portion extending from another edge of the opening. The lug and wall portion form a U-shaped structure. It proved comparatively simple to manufacture such a U-shaped structure by bending at least one part of the heat sink to be L-shaped with respect to a remaining part of said heat sink.

In an electric circuit in accordance with the invention, the lug may be in direct contact with the component. It is alternatively possible, however, to arrange a wedge between the component and the lug. Such a wedge may consist, for example, of a body made from a synthetic resin. If use is made of such a wedge, then the positioning of the lug is very insensitive to tolerances.

Preferably, the heat sink of an electric circuit in accordance with the invention is formed from a metal, preferably aluminum.

In many cases, an electric circuit in accordance with the invention comprises a number of components which, during operation, generate a comparatively large amount of heat. In that case, the electric circuit preferably comprises an equally large number of lugs, each component being in thermal contact with the wall of the heat sink, and each component being pressed against the wall of the heat sink by a lug, and each lug being formed by moving a part of the heat sink with respect to the remaining part of the heat sink in such a manner that an opening is formed in the heat sink, which opening adjoins the lug and the surface area of which is equal to that of the lug.

Electronic ballasts for energizing a lamp generally comprise a number of components which, during operation of the ballast, generate comparatively much heat. Therefore, the invention can very suitably be used in such electronic ballasts.

These and other aspects of the invention will be apparent from and elucidated with reference to the embodiment(s) described hereinafter.

DETAILED DESCRIPTION OF THE INVENTION

Figure 1:
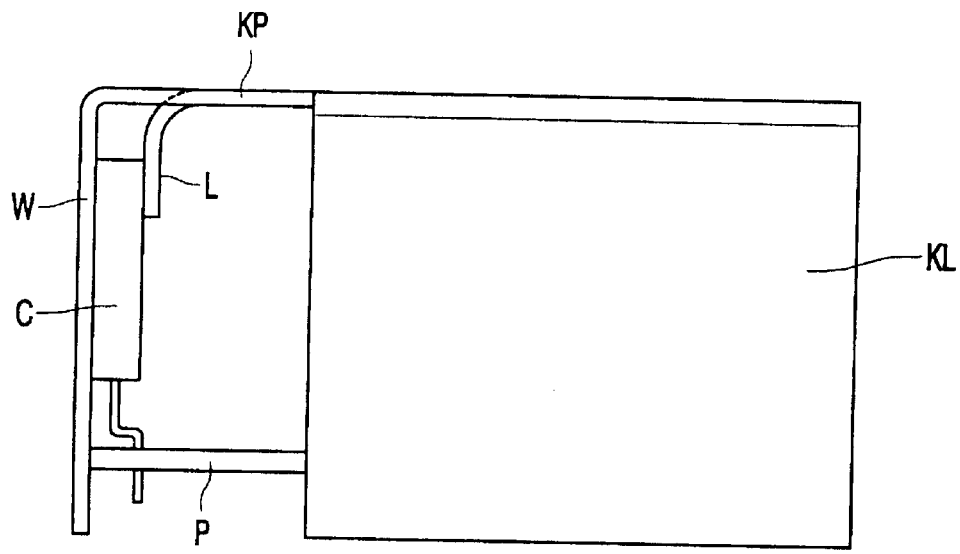
FIG. 1 is a diagrammatic, side elevation of an example of an electric circuit in accordance with the invention.

In FIG. 1, P denotes a printed circuit board for mounting electric components. C is an electric component mounted on printed circuit board P. Component C is, in this example, a power transistor. KL is a heat sink, which is formed from an aluminum sheet comprising a wall W and a flat cooling plate KP. The wall W extends at right angles to the printed circuit board P. Cooling plate KP extends parallel to the printed circuit board P. Heat sink KL is secured to the printed circuit board P, for example by means of mechanical securing means or by means of an adhesive. A first side of component C is in thermal contact with the wall W. In this example, this thermal contact is obtained in that component C directly engages the wall W. The thermal contact may also be obtained, however, by means of, for example, a body consisting of a material having a high coefficient of thermal conductivity, which is arranged between the component C and the wall W. L is a flat lug, which is formed by moving a part of the heat sink with respect to the remaining part of the heat sink in such a manner that an opening is formed in the heat sink. The opening is adjacent to the lug which therefore extends from an edge of the opening, and the surface area of the opening is equal to that of the lug. In this example, the opening is partly situated in the cooling plate KP and partly in the wall W. In this example, the lug L extends at right angles to the cooling plate KP and parallel to the wall L, the lug and wall and intervening portion of the plate KP thus forming a U-shaped structure. Lug L engages a second side of component C, which is situated opposite the first side of component C. The lug L presses the component C against the wall W of the heat sink with spring loading, as a result of which a good heat transfer from component C to wall W is ensured during operation of the electric circuit.

Figure 2:
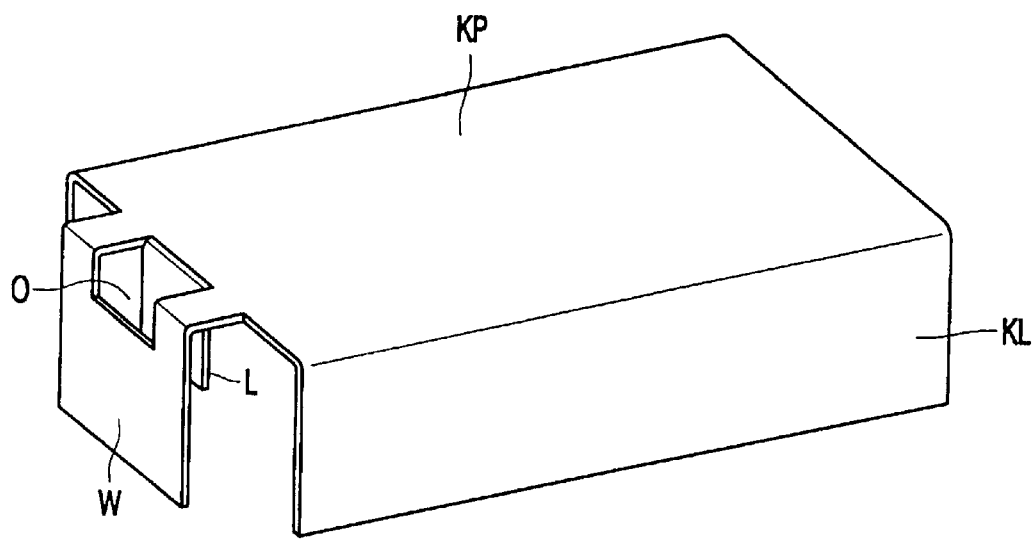
FIG. 2 shows a part of the heat sink of the example shown in FIG. 1.

FIG. 2 only shows a perspective view of the heat sink of the example shown in FIG. 1. O is the opening which adjoins the lug L, and which extends partly in the wall W and partly in the cooling plate KP.

Figure 3:
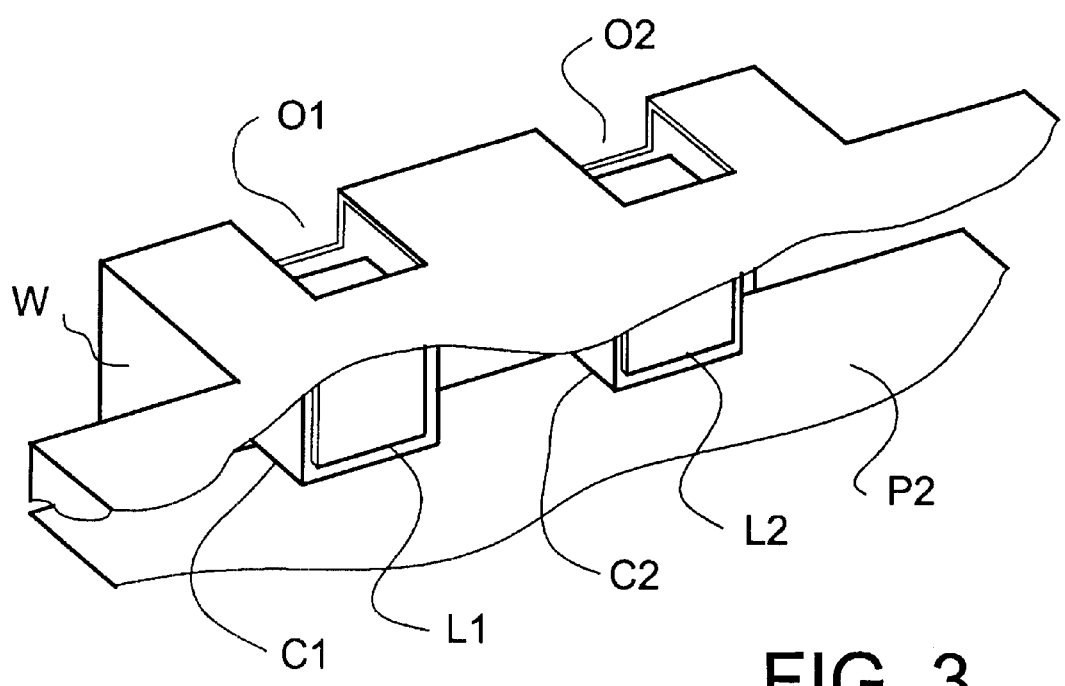
FIG. 3 is a partially cut-away view showing a circuit with more than one component and respective lugs.

FIG. 3 shows diagrammatically an electric circuit having two components C1 and C2 on circuit board P2. The components are pressed against wall W by lugs L1 and L2. As in the first-described embodiment, the lugs are bent from the sheet forming the heat sink KL2, thereby creating openings O1 and O2.

What is claimed is:

1. An electric circuit comprising:
    a printed circuit board,
    a component provided on the printed circuit board, and
    a heat sink secured to the printed circuit board,
    characterized in that the heat sink is a sheet of thermally conductive material having an opening having a first edge and a second edge, said sheet further having:
        a cooling plate portion, said first edge being in said cooling plate portion,
        a wall portion extending from said second edge and directly from and substantially perpendicular to said cooling plate portion, and
        a lug extending directly from said first edge, said lug being substantially perpendicular to said cooling plate portion,
        said component and said lug being arranged such that the lug presses the component into thermal contact against said wall portion.

2. An electric circuit as claimed in claim 1, wherein said sheet is made of aluminum.

3. An electric circuit as claimed in claim 1, characterized in that said lug, said wall portion, and a portion of said heat sink form a U-shaped structure.

4. An electric circuit as claimed in claim 1, characterized in that said opening has a given surface area, and said lug has a surface area substantially equal to the given surface area.

5. An electric circuit as claimed in claim 4, characterized in that said lug, said wall portion and a portion of said heat sink form a U-shaped structure.

6. An electric circuit as claimed in claim 1, characterized in that said aperture extends into said wall portion, second edge being in said wall portion.

7. An electric circuit comprising:
    a printed circuit board,
    a component provided on the printed circuit board, and
    a heat sink secured to the printed circuit board,
    characterized in that the heat sink is a sheet of thermally conductive material having an opening having a first edge and a second edge, and
    said sheet comprises:
        a wall portion extending from said second edge,
        a lug extending from said first edge, and
        a flat cooling plate which extends parallel to the printed circuit board, said first edge being in said cooling plate,
    said component and said lug being arranged such that the lug presses the component into thermal contact against said wall portion.

8. An electric circuit comprising:
    a printed circuit board,
    a plurality of components provided on the printed circuit board, and
    a heat sink secured to the printed circuit board,
    characterized in that the heat sink is a sheet of thermally conductive material having:
        a corresponding plurality of openings each having a respective first edge and a respective second edge,
        a corresponding plurality of lugs, each said lug extending from a respective first edge, and
        a wall portion extending from said respective second edges,
    said components and said lugs being arranged such that each lug presses a corresponding component against said wall portion.

9. An electric circuit as claimed in claim 8, characterized in that each said first edge is formed in a cooling plate portion of said sheet, and
    said wall portion and each said lug are each substantially perpendicular to said cooling plate portion.

10. An electric circuit as claimed in claim 8, characterized in that each said lug, said wall portion, and a portion of said heat sink form a corresponding U-shaped structure.

11. An electric circuit as claimed in claim 10, characterized in that each said first edge is formed in a cooling plate portion of said sheet, and
    said wall portion and each said lug are each substantially perpendicular to said cooling plate portion.

12. An electric circuit as claimed in claim 8, characterized in that each said opening has a respective surface area, and each said lug has a respective surface area equal to the respective surface area of the corresponding opening.

* * * * *